United States Patent
Intrater

(10) Patent No.: US 6,433,394 B1
(45) Date of Patent: Aug. 13, 2002

(54) OVER-VOLTAGE PROTECTION DEVICE FOR INTEGRATED CIRCUITS

(75) Inventor: James Intrater, Santa Clara, CA (US)

(73) Assignee: Oryx Technology Corporation, San Jose, CA (US)

( * ) Notice: Subject to any disclaimer, the term of this patent is extended or adjusted under 35 U.S.C. 154(b) by 0 days.

(21) Appl. No.: 09/684,530

(22) Filed: Oct. 6, 2000

Related U.S. Application Data

(63) Continuation of application No. 09/037,771, filed on Mar. 10, 1998, now Pat. No. 6,130,459.

(51) Int. Cl.[7] .......................................... H01L 23/495
(52) U.S. Cl. .................. 257/355; 257/666; 257/667; 257/668; 257/672; 257/678; 257/690; 257/691; 257/692; 257/772
(58) Field of Search .................. 257/355, 666–668, 257/672, 678, 690, 691, 692, 774

(56) References Cited

U.S. PATENT DOCUMENTS

| | | |
|---|---|---|
| 3,676,472 A | 7/1972 | Zilliken et al. |
| 4,103,274 A | 7/1978 | Burgess et al. |
| 4,298,416 A | 11/1981 | Casson |
| 4,483,973 A | 11/1984 | Lucas et al. |
| 4,499,234 A | 2/1985 | Pratt et al. |
| 4,514,529 A | 4/1985 | Beers et al. |
| 4,523,001 A | 6/1985 | Swiger et al. |
| 4,554,338 A | 11/1985 | Wengrovius |
| 4,563,498 A | 1/1986 | Lucas |
| 4,580,794 A | 4/1986 | Gibbons |
| 4,586,105 A | 4/1986 | Lippmann et al. |
| 4,726,991 A | 2/1988 | Hyatt et al. |
| 4,819,047 A | 4/1989 | Gilfeather et al. |
| 4,928,199 A | 5/1990 | Diaz |
| 4,945,395 A | 7/1990 | Suehiro |
| 4,977,357 A | 12/1990 | Shrier |
| 5,029,041 A | 7/1991 | Robinson et al. |
| 5,195,010 A | 3/1993 | Dresner |
| 5,246,388 A | 9/1993 | Collins et al. |
| 5,301,084 A | 4/1994 | Miller |
| 5,315,472 A | 5/1994 | Fong et al. |
| 5,340,641 A * | 8/1994 | Xu .............................. 428/209 |
| 5,498,901 A * | 3/1996 | Chillara et al. ............. 257/666 |
| 5,515,226 A | 5/1996 | Tailliet |
| 5,710,457 A | 1/1998 | Uno |
| 5,715,127 A | 2/1998 | Yu |
| 5,818,101 A * | 10/1998 | Schuster ...................... 257/659 |
| 5,825,084 A * | 10/1998 | Lau et al. .................... 257/700 |
| 6,130,459 A | 10/2000 | Intrater |

* cited by examiner

*Primary Examiner*—Jerome Jackson, Jr.
*Assistant Examiner*—Matthew E. Warren
(74) *Attorney, Agent, or Firm*—Burns, Doane, Swecker & Mathis LLP

(57) ABSTRACT

A protection device for integrated circuits which prevents inadvertent damage caused by over-voltage power surges. The protection device comprising an insulating carrier having a ground plane thereon and a plurality of conductive pads around a periphery thereof. The plurality of conductive pads are spaced from the ground plane with a precision gap therebetween. When the protection device is placed over the integrated circuit chip, the plurality of conductive pads are coupled to the bonding pads of the integrated circuit and at least one of the conductive pads is coupled to the ground plane.

15 Claims, 2 Drawing Sheets

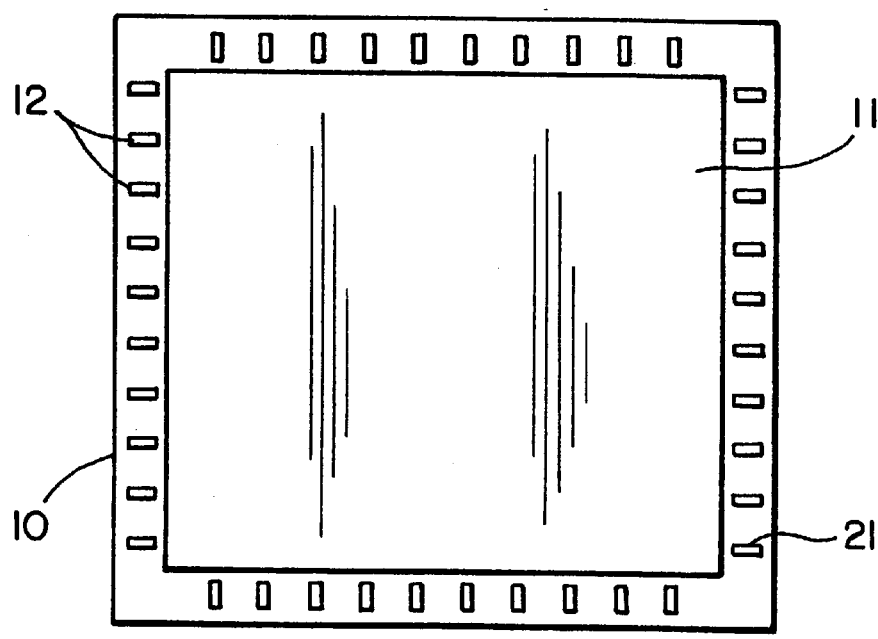
FIG_1
*(PRIOR ART)*
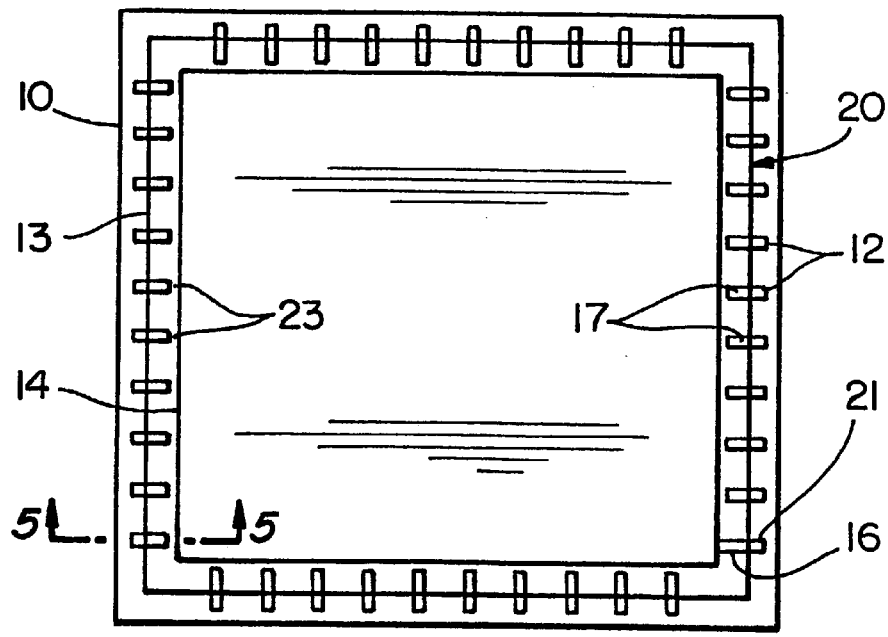
FIG_2

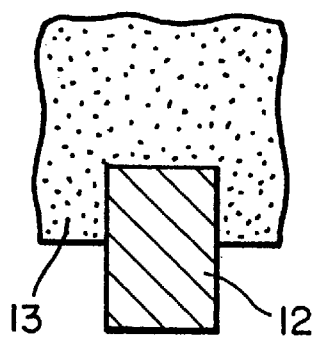
FIG_3
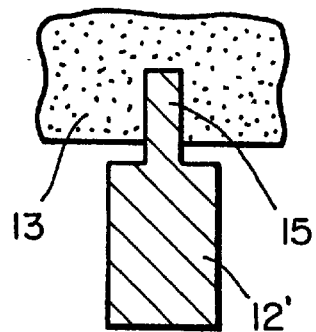
FIG_4
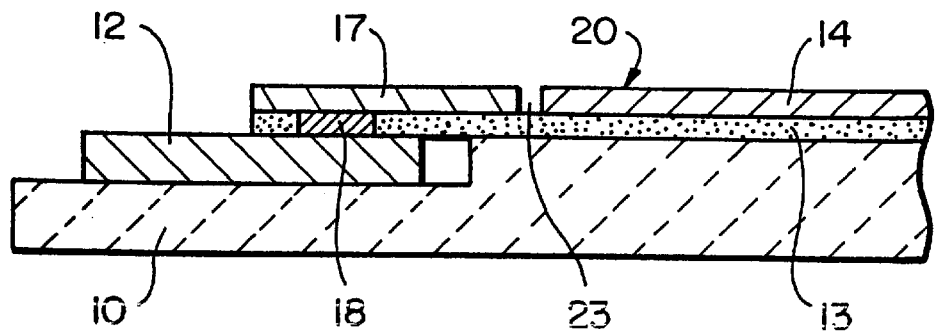
FIG_5
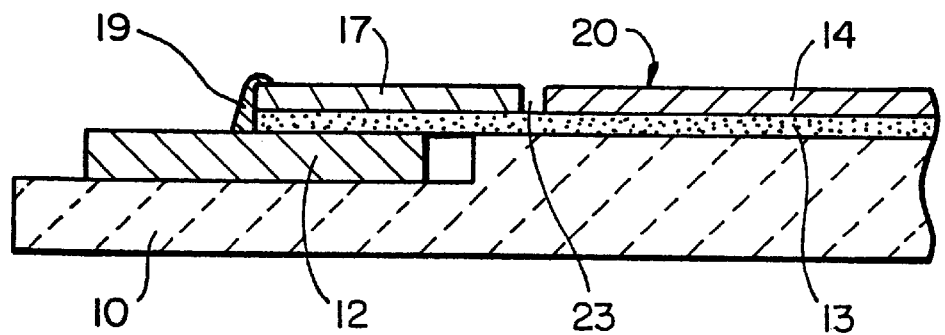
FIG_6

US 6,433,394 B1

OVER-VOLTAGE PROTECTION DEVICE FOR INTEGRATED CIRCUITS

This application is a continuation, of application Ser. No. 09/037,771, filed Mar. 10, 1998, now U.S. Pat. No. 6,130,459.

BACKGROUND OF THE INVENTION

This invention relates generally to semiconductor integrated circuits and more particularly, it relates to a protection device for integrated circuits to prevent inadvertent damage caused by over-voltage transients such as electrostatic discharge.

It is generally known that the magnitude of an electric voltage allowed to be applied to an integrated circuit package is rather limited since the physical size of the integrated circuit package is fairly small. When the integrated circuit package is not being used, for example, in storage or handling, the external leads or pins thereof are susceptible to the build-up of a static charge thereon. If the integrated circuit package happens to come in contact with a ground potential, the accumulated static charges will flow to ground. Such static discharge can be of a catastrophic nature with sufficient energy to cause damage or even destroy the semiconductor element or chip mounted within the integrated circuit package.

In order to protect the semiconductor chip in the integrated circuit package from being destroyed when such static discharges occur, there has been provided in the prior art a protection element such as a transistor element or a p-n junction applied with a reverse bias, which breaks down when the semiconductor chip encounters an unexpectedly high voltage.

SUMMARY OF THE INVENTION

The present invention provides an improved protection device for integrated circuits which prevents inadvertent damage caused by over-voltage power surges. The protection device overlays the integrated circuit chip and is coupled to (i.e., is in direct or indirect electrical communication with) the bonding pads of the integrated circuit so as to not require any special processing of the integrated circuit chip to accommodate the protection device. The present invention comprises an insulating carrier having a ground plane thereon and a plurality of conductive pads thereon around a periphery of the ground plane. The plurality of conductive pads are spaced from the ground plane with a precision gap therebetween. When the protection device is placed over the integrated circuit chip, the plurality of conductive pads are coupled to the bonding pads of the integrated circuit and at least one of the conductive pads is coupled to ground.

In one aspect of the invention there is provided a surge protection device for an integrated circuit chip, the device having an insulating layer, a ground plane on the insulating layer, a plurality of conductive pads around the periphery of the ground plane for coupling to the bonding pads of the integrated circuit chip, the plurality of conductive pads being spaced a predetermined distance from the ground plane, and a ground pad coupled to the ground plane.

In another aspect of the invention there is provided an integrated circuit protected from inadvertent damage caused by over-voltage transients having a semiconductor body having a central portion with circuit elements therein, a plurality of bonding pads disposed around the central portion and coupled to the circuit elements and an insulating layer having a ground plane thereon over-laying the central portion and a portion of each of the bonding pads and a plurality of conductive pads on the insulating layer coupled to the bonding pads and spaced a predetermined distance from the ground plane.

BRIEF DESCRIPTION OF THE DRAWINGS

The objects and advantages of the present invention will become more fully apparent from the following detailed description when read in conjunction with the accompanying drawings with like reference numerals indicating corresponding parts throughout, wherein:

FIG. 1 is a top plan view of a conventional integrated circuit chip;

to FIG. 2 is a top plan view of a conventional integrated circuit chip having a protection device constructed in accordance with the principles of the present invention;

FIG. 3 is an enlarged view of a bonding pad of the integrated circuit chip of FIG. 2;

FIG. 4 is an enlarged view of an alternate embodiment for the bonding pads of the integrated circuit chip;

FIG. 5 is an enlarged partial cross-sectional view taken along line 5—5 of FIG. 2; and FIG. 6 is an enlarged partial cross-sectional view of an alternate embodiment for coupling the conductive pads to the bonding pads taken along a line similar to line 5—5 of FIG. 2.

DETAILED DESCRIPTION OF THE PREFERRED EMBODIMENTS

Referring now in detail to the drawings, there is shown in FIG. 1 a top plan view of a semiconductor integrated circuit chip or die 10. The chip 10 has a generally square or rectangular-shaped semiconductor body of, for example, silicon and a large number of active and passive circuit elements (not shown) formed in its central portion 11. In order to supply signals that are to be processed to the chip and to obtain the processed signals from the chip, the chip 10 is provided with a large number of signal bonding pads 12 which are disposed near the periphery of the chip 10. These signal bonding pads 12 may consist of any combination of input bonding pads, output bonding pads, and input-output (I/O) bonding pads which are electrically coupled to the circuit elements contained in the central portion 11 of the chip 10.

The chip 10 is conventionally mounted within a package (not shown) provided with a plurality of external leads or pins (not shown), such as in a pin grid array, in a DIP (Dual In-Line Package) type or in a SIP (Single In-Line Package) type, and a hermetically sealing metal lid or a molded plastic package. Conventional wire-bonding and a flip-chip configuration using solder balls on the bonding pads 12 to connect the chip and protection device to the integrated circuit package is within the scope of the invention.

In order to prevent the chip 10 from being damaged or destroyed by an over-voltage transient such as electrostatic charges accumulated on any one of the plurality of external pins (not shown), the chip 10 of the present invention includes a protection device 20 for interlinking all the bonding pads 12 so that the surge on the external pin having the electrostatic charge will be routed immediately via low resistance pathways to the pin referenced to ground. Since an electrostatic discharge event (i.e., high voltage, low current, short duration) endangers the thin oxide films in the integrated circuit element and a large power dissipation causes heat which damages the junctions formed therein, the protection device 20 has been designed so as to convert the high voltage into a high current pulse which is caused to flow between the charged pin and ground.

In practice, this could be between any one of the plurality of external pins and any one of the other remaining pins.

In one embodiment, the protection device 20 of the present invention includes an electrically insulating layer or carrier 13 (as shown in FIGS. 3–5) with a conductive ground plane 14 (FIGS. 2, 5 and 6), such as but not limited to copper or nickel, attached thereto wherein the insulating layer 13 overlays the central portion 11 of the chip and a portion of each of the bonding pads 12. The ground plane 14, preferably extends substantially over the central portion of the insulation layer as shown but it is within the scope of the present invention that the ground plane forms a ring around the periphery of the central portion and adjacent the gap 23. The insulating layer 13 also has a plurality of conductive pads 17 thereon around the periphery of the ground plane 14 corresponding to the bonding pads 12 of the integrated circuit chip 10.

In the embodiment shown in FIG. 5, the conductive pads 17 are coupled to the bonding pads 12 through a conductor filled or plated via 18 through the insulating layer 13. In the embodiment shown in FIG. 6, the conductive pads 17 are coupled to the bonding pads 12 with a wrap-around conductor 19. A ground connection 16 is made between the ground plane 14 and the ground of the system, such as by coupling the ground plane to the ground pad 21 of the integrated circuit chip 10 or to a reference ground in the integrated circuit chip package.

As shown in FIGS. 2, 3 and 5, the insulating layer 13 and ground plane 14 extend over only a portion of the bonding pads 12 so as to leave a portion for conventional bonding of those pads to an integrated circuit package. It is also within the scope of the present invention for the insulating layer 13 and ground plane 14 to extend entirely over each of the bonding pads 12 whereby the integrated chip package would be conventionally wire-bonded or solder ball bonded in a flip-chip configuration to the conductive pads 17. Alternatively, as shown in FIG. 4, the bonding pads 12 can be modified slightly (designated 12') to include an extended portion 15. The extended portion 15 is covered by the insulating layer 13 and ground plane 14 so as to leave the entire bonding pad 12 available for conventional bonding of the pad to an integrated circuit package. As will be apparent from this embodiment, the insulating layer 13 and ground plane 14 do not have to (although preferably do) overlay the bonding pads 12 but rather just need to be in electrical communication with the bonding pads.

A precisely spaced gap or space 23 exists between each of the conductive pads 17 and the peripheral edge of the ground plane 14. The surge protection characteristics of the device 20 are determined by the width of the gap 23 and the material used in the gap, if any material is used in the gap. The gap can be filled with air as shown, a vacuum (which requires that any elements around the gap form a seal), or any material that will impede the flow of electrical current from a conductive pad 17 to the ground plane 14 across the gap 23 until there is an over-voltage condition. Generally speaking, the wider the gap 23 the higher the clamp voltage of the device 20. It has been found that a gap of less than about 1.6 mils or less, in some circumstances about 0.8 mils or less, will provide effective surge protection. It is preferable in many applications that the gap be less than about 0.5 mils and more preferably less than about 0.2 mils.

The conductive pads 17 and ground plane 14 are formed on the insulating carrier 13 using the standard photo-lithographic method of photo-resisting portions of a copper layer, imaging the pattern for the conductive pads and ground plane, and developing and etching the patterns into the copper layer and removing the photoresist. As one of ordinary skill will recognize, other methods can be used such as ultraviolet laser projection imaging, x-ray and electron beam lithography. The gap 23 can be formed using the standard photo-lithographic method or laser notching, such as with ultra-violet laser ablation.

As a result of the protection device 20 of the present invention, any over-voltage transient or electrostatic charge is kept away from the central portion 11 of the chip 10 containing the circuit elements by routing the high current from the charged bonding pad 12 through (or around the edge if a wrap-around conductor is used) the insulating layer 13 to the conductive pad 17 across the gap 23 to the ground plane 14 and out the grounded bonding pad 21, thereby avoiding the circuit elements of the central portion of the chip 10 and preventing inadvertent damage to the chip. The surge protection device 20 of the present invention is designed so as to switch from an insulator to a conductor only when a voltage received at the conductive pads 17 is higher than the normally allowable voltage for the integrated circuit chip. Typically, the ordinary integrated circuit chip operates with a relatively low voltage, i.e., 5 volts. Therefore, the surge protection device 20 comes into play only when the voltage is higher than 5 volts, otherwise the device 20 sits passively on the chip 10.

The insulating layer or carrier 13 can be any of a large variety of dielectrics or insulating materials. The insulating layer 13 acts as a passivation layer and as such can also be a conventional passivation layer of the integrated circuit chip. Examples of passivation layers include chemical vapor deposited or sputtered silicon nitride, silicon dioxide, carbides, RF sputtered ceramic material such as various doped and undoped titanantes, zirconates, niobates, tantalates, stanates, hafnates, and manganates.

As mentioned above, the gap 23 of the present invention can be filled with, but not limited to, a polymer, polymer-metal composite, glass, ceramic (e.g., AlN or $Al_2O_3$), polymer-glass composite, polymer-ceramic composite, dielectric, passivation layer material, or a non-linear resistance material to set the desired clamp voltage for the device. Surprisingly, it has been discovered that placing conventional passivation layer material, such as silicon dioxide or silicon nitride, between the ground plane and the conductive pads causes the conventional passivation layer material to operate like a non-linear resistance switching material when an over-voltage situation occurs.

Likewise, the material in the gap 23 can be a non-linear resistance material or any dielectric such as will impede the flow of electrical current from the conductive pads 17 to the ground plane 14 until there is an over-voltage condition. The non-linear resistance characteristics are determined by the width of the gap, the material used and the volume of the material. See U.S. Pat. No. 4,977,357 issued to Shrier, U.S. Pat. No. 4,928,199 issued to Diaz et al. and U.S. Pat. No. 4,726,991 issued to Hyatt et al. with respect to characteristics determined by the material used and the volume of the material. In operation, the non-linear resistance material initially has high electrical resistance. When the circuit experiences an over-voltage spike the non-linear resistance material quickly changes to a low electrical resistance state in order to short the over-voltage to the ground plane. After the over-voltage has passed, the material immediately reverts back to a high electrical resistance state. These non-linear resistance materials typically comprise finely divided particles dispersed in an organic resin or insulating medium. For example, U.S. Pat. No. 4,977,357 (Shrier) and U.S. Pat. No. 4,726,991 (Hyatt et al.) disclose such materials.

In another embodiment of the invention, the gap is filled with a neat dielectric polymer, glass, ceramic or composites thereof, it has been found that the surge protection device 20 is surprisingly effective at a desired range of clamping voltages provided that the gap 23 and thus the amount of neat dielectric polymer, glass, ceramic or composites thereof is sufficiently narrow. It has been found that for some polymers a gap of less than about 0.8 mil will provide effective over-voltage protection under various conditions, while for other polymers a gap of less than about 1.6 mils provides the desired performance characteristics. It is preferable in many applications that the gap be less than about 0.5 mil and more preferably less than about 0.2 mil. Similarly, when the gap 23 is filled with a glass it is preferred that the gap be less than about 0.8 mil, but for some glasses in certain applications a gap of up to about 1.6 mils is appropriate. As will be appreciated by one skilled in the art, the actual gap width used and filled by the neat dielectric polymer, glass, ceramic or composites thereof employed in a particular over-voltage protection function will vary depending on the type of polymer or glass used, the operating conditions of the IC chip in which the material is employed and the performance properties required of the surge protection device.

As used in the disclosure and description of the present invention, the term "neat dielectric polymer, glass, ceramic or composites thereof" refers to a polymeric, glass, ceramic or composite thereof material which can act as a dielectric or insulating material under the normal voltage and current conditions of intended use and which is unfilled, i.e., does not contain conductive or semiconductive particles such as those typically used in binders or otherwise associated with non-linear resistance materials of the prior art. However, "neat dielectric polymer, glass, ceramic or composites thereof" is intended to include polymeric, glass, ceramic or composites thereof materials which fulfill the above criteria, but which may contain or have added to them insulative or inert particles or materials that are inactive or do not interfere with the desired dielectric/over-voltage protection properties of the polymer or glass as used in the present invention.

The polymers and glasses useful in this aspect of the invention can be selected from polymers known in the art to be useful as binders in conventional non-linear resistance materials to the extent that such polymers are known to have high resistance to tracking and high resistance to arcing. In addition, other polymers and glasses not previously suitable for or used as such binders are also useful in the present invention if they exhibit sufficient dielectric properties, sufficient resistance to tracking and sufficient resistance to arcing under the operating conditions selected for a device according to this invention.

In general, the types of polymers useful in the present invention include silicone rubber and elastomer, natural rubber, organopolysiloxane, polyethylene, polypropylene, polystyrene, poly(methyl methacrylate), polyacrylonitrile, polyacetal, polycarbonate, polyamide, polyester, phenol-formaldehyde resin, epoxy resin, alkyd resin, polyurethane, polyamide, phenoxy resin, polysulfide resin, polyphenylene oxide resin, polyvinyl chloride, fluoropolymer and chlorofluoropolymer. These and other useful polymers can be used by themselves or can include various substituent groups and can be mixtures, blends or copolymers thereof, wherein the final polymer is selected in accordance with the criteria described above. A particularly preferred polymer is a conventional and commercially available General Electric "615" silicone, and it is also particularly preferred to cure this polymer for about 15 minutes at about 200° C. to obtain properties better suited for use in this invention. It has been found that this polymer provides good performance in a thickness of about 0.2 mil. Another form of polymer useful in this invention is woven or nonwoven polymer fibers compressed into a mat. For example, a polymer fiber material useful in the present invention is a nonwoven aramid (aromatic polyamide) fibers, commercially available as "KEVLAR" or "NOMEX" nonwoven fiber mat from E.I. Du Pont de Nemours & Company. The nonwoven aramid fiber mat of about 1.6 mils has been found to provide good performance when compressed to 0.8 mils.

The glass materials useful in this invention are likewise glass materials which have been used as binders in non-linear resistance materials such as sodium silicate. A dielectric glass, such as a sodium silicate is generally useful in this invention in thicknesses similar to those outlined above for the polymer materials. Further, glass fibers can be used to form the dielectric glass in accordance with this invention.

As will be appreciated by one skilled in the art, various dielectric polymers and glasses can be used in this invention following the teachings contained herein with respect to the distance that must be maintained for the neat dielectric polymer, glass, ceramic or composites thereof to exhibit the desired clamping voltage and other desired properties. Examples of polymers which can be employed in this invention include those disclosed in U.S. Pat. Nos. 4,298,416, 4,483,973, 4,499,234, 4,514,529, 4,523,001, 4,554,338, 4,563,498, 4,580,794, the disclosures of which are incorporated herein by reference. As indicated, other resins may be selected for use in accordance with this invention.

In another aspect of this invention, it has been found that the above described neat dielectric polymer, glass, ceramic or composites thereof can be used in combination with a non-linear resistance material to modify and enhance certain properties and performance characteristics of the non-linear resistance. As referred to as part of this invention, the non-linear resistance material can be a conventional variable voltage material which comprises a binder containing conductive particles and/or semiconductive particles and/or insulative particles. As used in this invention, the non-linear resistance material may also include other novel, modified and improved non-linear resistance materials or over-voltage components such as disclosed in this specification.

The non-linear resistance material used in accordance with the present invention can be any non-linear resistance material known in the art, for example those disclosed in either U.S. Pat. No. 4,977,357 (Shrier) or U.S. Pat. No. 4,726,991 (Hyatt et al.), which are incorporated herein by reference. Generally, the non-linear resistance material comprises a binder and closely spaced conductive particles homogeneously distributed in the binder and spaced to provide electrical conduction. In addition, various material such as that disclosed in U.S. Pat. No. 4,103,274 (Burgess et al.) can be used in accordance with the present invention.

From the foregoing detailed description, it can be seen that the present invention provides an improved protection device for integrated circuits to prevent inadvertent damage caused by over-voltage transients which includes means for interlinking all of the bonding pads so that the surge on the pad having the over-voltage transient charge will be routed immediately via low resistance pathways to the bonding pad referenced to ground.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to any particular embodiment disclosed as the best mode contemplated for carrying out the invention, but that the invention will include all embodiments falling within the scope of the appended claims.

What is claimed is:

1. A surge protection device for an integrated circuit chip, the device comprising:
    an insulating layer wherein at least a portion of the layer lies within the perimeter of the integrated circuit chip;
    a ground plane on the insulating layer;
    a plurality of conductive pads around the periphery of the ground plane for coupling to bonding pads of the integrated circuit chip, the plurality of conductive pads being spaced a predetermined distance from the ground plane; and
    a ground pad on the insulating layer coupled to the ground plane.

2. The surge protection device of claim 1 wherein the insulating layer is configured to overlap a portion of the bonding pads of the integrated circuit chip.

3. The surge protection device of claim 1 wherein the insulating layer is configured to overlap an extended portion of the bonding pads of the integrated circuit chip.

4. The surge protection device of claim 1 further comprising a plurality of vias through the insulating layer for coupling the conductive pads to the bonding pads of the integrated circuit chip.

5. The surge protection device of claim 1 further comprising a wrap-around conductor for coupling the conductive pads to the bonding pads of the integrated circuit chip.

6. The surge protection device of claim 1 wherein the insulating layer is a passivation layer.

7. The surge protection device of claim 1 wherein the ground plane overlays a central portion of the insulating layer.

8. The surge protection device of claim 1 wherein the predetermined distance between the conductive pads and the ground plane is filled with a silicone or silicone-based composition.

9. The surge protection device of claim 1 wherein the predetermined distance between the conductive pads and the ground plane is filled with a non-linear resistance material.

10. The surge protection device of claim 1 wherein the predetermined distance between the conductive pads and the ground plane is filled with a neat dielectric polymer, glass, ceramic or composite thereof.

11. An integrated circuit protected from inadvertent damage caused by over-voltage transients, comprising:
    a semiconductor body having a central portion with circuit elements therein;
    a plurality of bonding pads disposed around the central portion and coupled to the circuit elements;
    an insulating layer having a ground plane thereon overlaying the central portion and a portion of each of the bonding pads; and
    a plurality of conductive pads on the insulating layer coupled to the bonding pads and spaced a predetermined distance from the ground plane.

12. The integrated circuit of claim 11 wherein the portion of each of the bonding pads overlaid by the insulating layer is an extension of the bonding pad.

13. The integrated circuit of claim 11 wherein the insulating layer is a passivation layer.

14. The integrated circuit of claim 11 wherein the conductive pads are coupled to the bonding pads through a plurality of vias through the insulating layer.

15. The integrated circuit of claim 11 wherein the conductive pads are coupled to the bonding pads by a wrap-around conductor.

* * * * *